United States Patent
Nguyen et al.

(10) Patent No.: US 12,431,339 B2
(45) Date of Patent: Sep. 30, 2025

(54) ADJUSTABLE DE-CHUCKING VOLTAGE

(71) Applicant: Applied Materials, Inc., Santa Clara, CA (US)

(72) Inventors: Andrew Nguyen, San Jose, CA (US); Lu Liu, San Jose, CA (US); Toan Q. Tran, San Jose, CA (US); Daniel Nguyen, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 217 days.

(21) Appl. No.: 18/307,931

(22) Filed: Apr. 27, 2023

(65) Prior Publication Data
US 2024/0363315 A1    Oct. 31, 2024

(51) Int. Cl.
*H01J 37/32*    (2006.01)
*H01L 21/683*   (2006.01)

(52) U.S. Cl.
CPC ......... *H01J 37/32697* (2013.01); *H01J 37/32724* (2013.01); *H01L 21/6833* (2013.01); *H01J 2237/2007* (2013.01); *H01J 2237/20235* (2013.01); *H01J 2237/24564* (2013.01); *H01J 2237/24585* (2013.01); *H01J 2237/3321* (2013.01); *H01J 2237/3327* (2013.01)

(58) Field of Classification Search
CPC .......... H01J 37/32697; H01J 37/32724; H01L 21/6833
See application file for complete search history.

(56) References Cited

U.S. PATENT DOCUMENTS

| | | |
|---|---|---|
| 5,818,682 A | 10/1998 | Loo |
| 5,956,837 A | 9/1999 | Shiota et al. |
| 6,255,223 B1 | 7/2001 | Matsuda et al. |
| 6,584,669 B1 | 7/2003 | Gourdet et al. |
| 6,646,857 B2 | 11/2003 | Anderson et al. |
| 6,898,064 B1 | 5/2005 | Berman et al. |
| 6,965,506 B2 | 11/2005 | Howald |
| 7,292,428 B2 | 11/2007 | Hanawa et al. |
| 7,813,103 B2 | 10/2010 | Shannon et al. |
| 8,363,378 B2 | 1/2013 | Bluck et al. |
| 9,466,519 B2 | 10/2016 | Kawabata |
| 9,558,919 B2 | 1/2017 | Kondo et al. |
| 2006/0238953 A1 | 10/2006 | Hirojuhanawa et al. |
| 2010/0208409 A1 | 8/2010 | Bluck et al. |

(Continued)

OTHER PUBLICATIONS

International Search Report and Written Opinion dated Jul. 25, 2024 for Application No. PCT/US2024/024709.

*Primary Examiner* — Scott Bauer
(74) *Attorney, Agent, or Firm* — Patterson + Sheridan, LLP (57) ABSTRACT

Aspects of the present disclosure generally relate to apparatus and methods for an adjustable de-chucking voltage associated with an electrostatically charged substrate in a processing chamber. An example method of de-chucking a substrate disposed in a process chamber includes processing a substrate in a chamber body, the substrate being coupled to a substrate support comprising a chucking electrode. The method further includes monitoring a property associated with a lift pin assembly movable relative to the chucking electrode via an actuator. The method further includes adjusting a first voltage level applied to the chucking electrode in response to the property associated with the lift pin assembly satisfying one or more criteria.

18 Claims, 6 Drawing Sheets

(56) References Cited

U.S. PATENT DOCUMENTS

| | | |
|---|---|---|
| 2011/0061810 A1 | 3/2011 | Ganguly et al. |
| 2012/0070996 A1 | 3/2012 | Hao |
| 2019/0074209 A1* | 3/2019 | Sasaki ................. H01L 21/6833 |
| 2020/0357675 A1 | 11/2020 | Noorbakhsh et al. |
| 2020/0365441 A1* | 11/2020 | Hu .................... H01L 21/68757 |
| 2022/0208598 A1 | 6/2022 | Tan et al. |

* cited by examiner

ADJUSTABLE DE-CHUCKING VOLTAGE

BACKGROUND

Field

Embodiments of the present disclosure generally relate to apparatus and methods used in the manufacture of semiconductor devices. More particularly, embodiments of the present disclosure relate to a substrate processing chamber, and components thereof, for forming semiconductor devices and de-chucking such devices.

Description of the Related Art

Integrated circuits have evolved into complex devices that can include millions of transistors, capacitors and resistors on a single chip. The evolution of chip designs continually involves faster circuitry and greater circuit density. The demands for faster circuits with greater circuit densities impose corresponding demands on the materials used to fabricate such integrated circuits. In particular, as the dimensions of integrated circuit components are reduced to the sub-micron scale, there is a trend to use low resistivity conductive materials as well as low dielectric constant insulating materials to obtain suitable electrical performance from such components.

The demands for greater integrated circuit densities also impose demands on the process sequences used in the manufacture of integrated circuit components. For example, in process sequences that use conventional photolithographic techniques, a layer of energy sensitive resist is formed over a stack of material layers disposed on a substrate. The energy sensitive resist layer is exposed to an image of a pattern to form a photoresist mask. Thereafter, the mask pattern is transferred to one or more of the material layers of the stack using an etch process. The chemical etchant used in the etch process is selected to have a greater etch selectivity for the material layers of the stack than for the mask of energy sensitive resist. That is, the chemical etchant etches the one or more layers of the material stack at a rate much faster than the energy sensitive resist. The etch selectivity to the one or more material layers of the stack over the resist prevents the energy sensitive resist from being consumed prior to completion of the pattern transfer.

As the pattern dimensions are reduced, the thickness of the energy sensitive resist is correspondingly reduced in order to control pattern resolution. Such thin resist layers can be insufficient to mask underlying material layers during the pattern transfer process due to attack by the chemical etchant. An intermediate layer (e.g., silicon oxynitride, silicon carbine or carbon film), called a hardmask, is often used between the energy sensitive resist layer and the underlying material layers to facilitate pattern transfer because of greater resistance to the chemical etchant. Hardmask materials having both high etch selectivity and high deposition rates are often utilized. In hardmask formation operations, substrates are conventionally chucked to substrate supports to facilitate processing. Similarly, during cleaning operations, cover substrates are positioned over and chucked to the substrate support to protect the substrate support. However, dechucking of the substrate and/or cover substrate presents challenges. Thus, what is needed in the art are improved methods and apparatus for fabricating semiconductor devices.

SUMMARY

Embodiments of the present disclosure generally relate to apparatus and methods utilized in the manufacture of semiconductor devices. More particularly, embodiments of the present disclosure relate to de-chucking an electrostatically charged substrate in a processing chamber using an adjustable de-chucking voltage.

Some aspects provide a method of de-chucking a substrate disposed in a process chamber. The method includes processing a substrate in a chamber body, the substrate being coupled to a substrate support comprising a chucking electrode. The method further includes monitoring a property associated with a lift pin assembly movable relative to the chucking electrode via an actuator. The method further includes adjusting a first voltage level applied to the chucking electrode in response to the property associated with the lift pin assembly satisfying one or more criteria.

Some aspects provide a process chamber. The chamber includes a lid assembly. The chamber further includes a substrate support disposed and movable within the a process volume, wherein the substrate support comprises a chucking electrode and a lift pin assembly, wherein the lift pin assembly is movable relative to the chucking electrode via an actuator. The chamber further includes a power source electrically coupled to the chucking electrode. The chamber further includes a memory and a processor coupled to the memory. The processor is configured to monitor a property associated with the lift pin assembly, and adjust a voltage level applied to the chucking electrode via the power source in response to the property associated with the lift pin assembly satisfying one or more criteria.

Some aspects provide a process chamber. The chamber includes a lid assembly. The chamber further includes a chamber body coupled to the lid assembly by a spacer, the spacer and the chamber body defining a process volume. The chamber further includes a substrate support disposed and movable within the process volume, wherein the substrate support comprises a chucking electrode, a heater element, and a lift pin assembly, wherein the lift pin assembly is movable relative to the chucking electrode via an actuator. The chamber further includes a power source electrically coupled to the chucking electrode. The chamber further includes a memory and a processor coupled to the memory. The processor is configured to monitor a property associated with the lift pin assembly, monitor a first voltage level associated with the heater element, and adjust a second voltage level applied to the chucking electrode via the power source based at least in part on the first voltage level in response to the property associated with the lift pin assembly satisfying one or more criteria.

BRIEF DESCRIPTION OF THE DRAWINGS

So that the manner in which the above recited features of the present disclosure can be understood in detail, a more particular description of the disclosure, briefly summarized above, can be had by reference to embodiments, some of which are illustrated in the appended drawings. It is to be noted, however, that the appended drawings illustrate only typical embodiments of this disclosure and are therefore not to be considered limiting of scope, for the disclosure can admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Aspects of the present disclosure provide apparatus and methods for de-chucking a substrate in a processing chamber using an adjustable de-chucking voltage.

In semiconductor processing, a silicon wafer or other type of flat workpiece (e.g., a substrate) may be exposed to a sequence of processes to form layers and pattern of conductive and dielectric materials. These materials make up the transistors, connections, and other components of the eventual semiconductor die. The processes may be performed in several different processing chambers. A chuck, carrier, pedestal, or another type of holder may be used to hold the substrate as the substrate is moved between chambers. The substrate may be carried by one carrier and then transferred to another support as the substrate moves from one process to another.

An electrostatic chuck (ESC) may be used as a holder to electrostatically clamp on to a substrate in a semiconductor plasma processing chamber. The ESC uses an electrostatic force to grip the substrate during plasma and during other types of processes. At the end of a process or when the substrate is to be transferred to a different support, the electrostatic charge may be discharged so that the substrate can be released from the ESC. For example, a de-chucking voltage may be applied to the substrate to match the voltage level of the electrostatic charge of the substrate and facilitate the electrostatic discharge. In some cases, a processing chamber may be configured to operate at a specific de-chucking voltage that is based on a particular substrate, such as a silicon wafer. Besides a silicon wafer, other types of substrate and/or wafer materials may be used (e.g., a cover wafer of aluminum nitride (AlN) and silicon oxide ($SiO_x$)) may be used for chamber cleaning. Due to the inconsistency and/or variation of cover substrate materials, a specific de-chucking voltage may vary and/or cause improper de-chucking, and as a result, a substrate may move out of pocket or break during the de-chucking process.

Aspects of the present disclosure provide apparatus and methods for de-chucking a substrate (e.g., a wafer or workpiece) using an adjustable voltage. For example, the torque applied to a lift pin may be monitored when the lift pin is used to lift up the substrate during the de-chucking process. If the torque value is above a certain threshold (for example, due to a variation in the substrate material), a processing system may re-determine the substrate potential and provide the updated de-chucking voltage to a power supply. As a result, the de-chuck voltage is corrected, and substrates of various materials can be de-chucked successfully.

The apparatus and methods described herein may provide various advantages. For example, the apparatus and methods described herein for de-chucking a substrate may improve the reliability of the de-chucking process (e.g., by performing the de-chucking process without damaging the substrate or reducing the occurrences of such damage). The apparatus and methods described herein for de-chucking a substrate may reduce substrate transfer related defects and/or reduce the tool down time, for example, due to efficient de-chucking afforded by the adjustable voltage. The apparatus and methods described herein allow for a de-chucking process that can be performed independent of the substrate material, and thus, allowing for a variety of materials to be processed in the processing chamber. The apparatus and methods described herein may allow for reduced costs on new cover substrate quality control, for example, due to the ability to de-chuck a variety of materials from the chamber.

Embodiments of the present disclosure relate to a substrate processing chamber utilized in substrate processing in the manufacture of electronic devices. Substrate processing includes deposition processes, etch processes, as well as other low pressure, processes, plasma processes, thermal processes used to manufacture electronic devices on substrates. Examples of processing chambers and/or systems that may be adapted to benefit from exemplary aspects of the disclosure is the PIONEER™ PECVD system commercially available from Applied Materials, Inc., located in Santa Clara, California. It is contemplated that other processing chambers and/or processing platforms, including those from other manufacturers, may be adapted to benefit from aspects of the disclosure.

Embodiments of the deposition chamber disclosed herein may be utilized for the fabrication of memory devices, and in particular, for the deposition of hardmasks utilized during fabrication of memory devices. Current memory devices are able to retain stored data for a very long period of time without applying a voltage thereto, and the reading rate of such memory devices is relatively high. It is relatively easy to erase stored data and rewrite data into the memory devices. Thus, memory devices have been widely used in micro-computers, and automatic control systems, etc. To increase the bit density and reduce the cost per bit of memory devices, 3D NAND (three-dimensional not AND) memory devices have been developed. Other memory devices, such as DRAM (dynamic random access memory), EM (expanded memory) and ReRAM (resistive random access memory), as well as advanced hardmask materials for forming the same, are also being developed to further facilitate advances in the semiconductor industry.

Vertical gate 3D memory cells are being explored for 3D NAND technologies to reduce cost as the number of memory cell layers increase. Oxide/silicon and oxide/nitride layer stacks are useful due to material integration advantages, but with an increasing number of memory cell layers, thickness of the layers becomes a limiting factor. Thus, while there is an interest in reducing the thickness of the memory cell layers, issues of oxide quality (e.g. breakdown voltage), silicon resistivity, and high aspect ratio etching persist with the reduced layer thickness.

Plasma Processing Chamber Example

Figure 1:
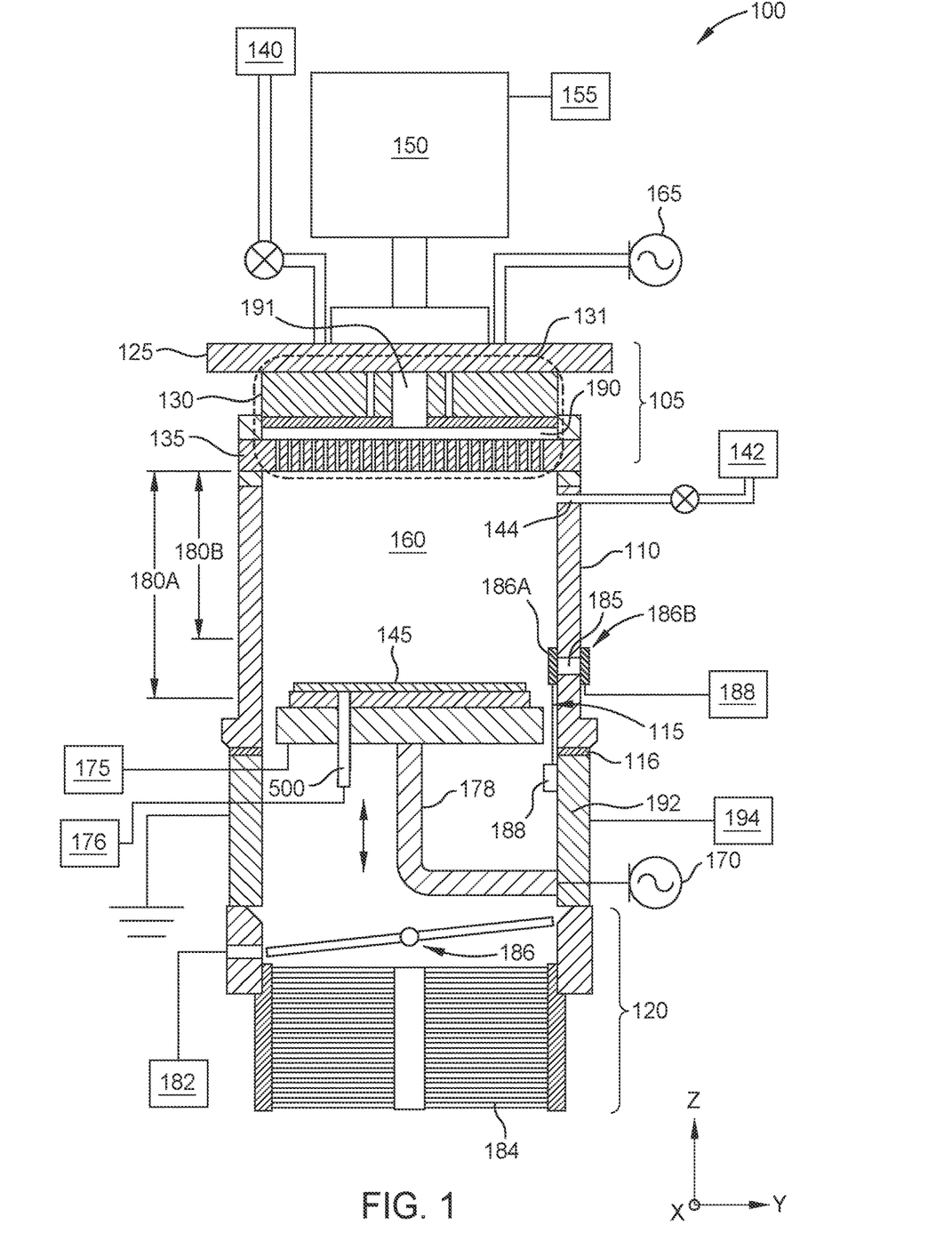
FIG. 1 is a schematic side cross sectional view of an illustrative processing chamber.

FIG. 1 is a schematic side cross sectional view of an illustrative processing chamber 100 suitable for conducting a deposition process. In one embodiment, which can be combined with other embodiments described herein, the processing chamber 100 may be configured to deposit advanced patterning films onto a substrate, such as hardmask films, for example amorphous carbon hardmask films.

The processing chamber 100 includes a lid assembly 105, a substrate support 115, and a variable pressure system 120. In some cases, the processing chamber includes a spacer 110 disposed on a chamber body 192. The lid assembly 105 includes a lid plate 125 and a heat exchanger 130. In the embodiment shown, which can be combined with other embodiments described herein, the lid assembly 105 also includes gas diffuser 131. As illustrated, the gas diffuser 131 includes a showerhead 135. However, in other embodiments, which can be combined with other embodiments described herein, the lid assembly 105 may include a concave or dome-shaped gas introduction plate, and/or a nozzle assembly as an alternative to the showerhead 135.

The lid assembly 105 is coupled to a first processing gas source 140. The first processing gas source 140 contains precursor gases for forming films on a substrate 145 supported on the substrate support 115. As an example, the first processing gas source 140 includes precursor gases such as carbon containing gases, hydrogen containing gases, helium, among others. In a specific example, the carbon containing gas includes acetylene ($C_2H_2$). The first processing gas source 140 provides precursors gases to a plenum 190 disposed in the lid assembly 105. The lid assembly includes one or more channels for directing precursor gases from the first processing gas source 140 into the plenum 190. From the plenum, the precursor gases flow through the showerhead 135 into a processing volume 160. In some embodiments, which can be combined with other embodiments described herein, a second processing gas source 142 is fluidly coupled to the processing volume 160 via an inlet 144 disposed through the spacer 110. As an example, the second processing gas source 142 includes precursor gases such as carbon containing gases, hydrogen containing gases, helium, among others, for example $C_2H_2$. In one some embodiment, which can be combined with other embodiments described herein, a total flow rate of precursor gases into the processing volume 160 is about 100 sccm to about 2 slm. The flow of precursor gases in the processing volume 160 via the second processing gas source 142 modulates the flow of precursor gases flow through the showerhead 135 such that the precursor gases are uniformly distributed in the processing volume 160. In one example, a plurality of inlets 144 may be radially distributed about the spacer 110. In such an example, gas flow to each of the inlets 144 may be separately controlled to further facilitate gas uniformity within the processing volume 160.

The lid assembly 105 is also coupled to an optional remote plasma source 150. The remote plasma source 150 is coupled to a cleaning gas source 155 for providing cleaning gases to the processing volume 160 formed inside the spacer 110 between the lid assembly 105 and the substrate 145. In one example, cleaning gases are provided through a central conduit 191 formed axially through the lid assembly 105. In some cases, the lid assembly 105 may include a gas distributor 131 which may include the heat exchanger 130, the showerhead 135, the plenum, the central conduit 191, or any combination or aspect thereof. In another example, cleaning gases are provided through the same channels which direct precursor gases. Example cleaning gases include oxygen-containing gases such as oxygen and/or ozone, as well fluorine containing gases such as $NF_3$, or combinations thereof.

In addition to or as an alternative to the remote plasma source 150, the lid assembly 105 is also coupled to a first or upper radio frequency (RF) power source 165. The first RF power source 165 facilitates maintenance or generation of plasma, such as a plasma generated from a cleaning gas. In one example, the remote plasma source 150 is omitted, and the cleaning gas is ionized into a plasma in situ via the first RF power source 165. The substrate support 115 is coupled to a second or lower RF power source 170. The first RF power source 165 may be a high frequency RF power source (for example, about 13.56 MHz to about 120 MHZ) and the second RF power source 170 may be a low frequency RF power source (for example, about 2 MHz to about 13.56 MHZ). It is to be noted that other frequencies are also contemplated. In some implementations, the second RF power source 170 is a mixed frequency RF power source, providing both high frequency and low frequency power. Utilization of a dual frequency RF power source, particularly for the second RF power source 170, improves film deposition. In one example, utilizing a second RF power source 170 provides dual frequency powers. A first frequency of about 2 MHz to about 13.56 MHz improves implantation of species into the deposited film, while a second frequency of about 13.56 MHz to about 120 MHz increases ionization and deposition rate of the film.

One or both of the first RF power source 165 and the second RF power source 170 are utilized in creating or maintaining a plasma in the processing volume 160. For example, the second RF power source 170 may be utilized during a deposition process and the first RF power source 165 may be utilized during a cleaning process (alone or in conjunction with the remote plasma source 150). In some deposition processes, the first RF power source 165 is used in conjunction with the second RF power source 170. During a deposition or etch process, one or both of the first RF power source 165 and the second RF power source 170 provide a power of about 100 Watts (W) to about 20,000 W in the processing volume 160 to facilitate ionization of a precursor gas. In one embodiment, which can be combined with other embodiments described herein, at least one of the first RF power source 165 and the second RF power source 170 are pulsed. In another embodiment, which can be combined with other embodiments described herein, the precursor gas includes helium and $C_2H_2$. In one embodiment, which can be combined with other embodiments described herein, $C_2H_2$ is provided at a flow rate of about 10 sccm to about 1,000 sccm and He is provided at a flow rate of about 50 sccm to about 10,000 sccm.

The substrate support 115 is coupled to an actuator 175 (e.g., a lift actuator) that provides movement thereof in the Z direction. The substrate support 115 is also coupled to a facilities cable 178 that is flexible which allows vertical movement of the substrate support 115 while maintaining communication with the second RF power source 170 as well as other power and fluid connections. The spacer 110 may be disposed on the chamber body 192. A height of the spacer 110 allows movement of the substrate support 115 vertically within the processing volume 160. The height of the spacer 110 is about 0.5 inches to about 20 inches. In some cases, the chamber body 192 may be formed without a separate spacer 110. In one example, the substrate support 115 is movable from a first distance 180A to a second distance 180B relative to the lid assembly 105 (for example, relative to a lower surface of the showerhead 135). In one embodiment, the second distance 180B is about ⅔ of the first distance 180A. For example, the difference between the first distance 180A and the second distance is about 5 inches to about 6 inches. Thus, from the position shown in FIG. 1, the substrate support 115 is movable by about 5 inches to about 6 inches relative to a lower surface of the showerhead 135. In another example, the substrate support 115 is fixed at one of the first distance 180A and the second distance 180B. In contrast to some plasma enhanced chemical vapor deposition (PECVD) processes, the spacer 110 greatly increases the distance between (and thus the volume between) the substrate support 115 and the lid assembly 105. The increased distance between the substrate support 115 and the lid assembly 105 reduces collisions of ionized species in the volume process volume 160, resulting in deposition of film with less neutral stress, such as less than 2.5 gigapascal (GPa). Films deposited with less neutral stress facilitate improved planarity (e.g., less bowing) of substrates upon which the film is formed. Reduced bowing of substrates results in improved precision of downstream patterning operations. In certain aspects, the substrate support 115 may include a lift pin assembly 500 (sometimes referred to as a lift pin spider) that is movable in the Z direction to lift the substrate 145 during the de-chucking process as further described herein. The lift pin assembly 500 may be coupled to an actuator 176 (e.g., a motor) that provides the movement thereof. As an example, the actuator may be configured to output a torque being applied to the lift pin assembly 500.

The variable pressure system 120 includes a first pump 182 and a second pump 184. The first pump 182 is a roughing pump that may be utilized during a cleaning process and/or substrate transfer process. A roughing pump is generally configured for moving higher volumetric flow rates and/or operating a relatively higher (though still sub-atmospheric) pressure. In one example, the first pump 182 maintains a pressure within the processing chamber less than 50 mtorr during a cleaning process. In another example, the first pump 182 maintains a pressure within the processing chamber of about 0.5 mTorr to about 10 Torr. Utilization of a roughing pump during cleaning operations facilitates relatively higher pressures and/or volumetric flow of cleaning gas (as compared to a deposition operation). The relatively higher pressure and/or volumetric flow during the cleaning operation improves cleaning of chamber surfaces.

The second pump 184 may be one a turbo pump and a cryogenic pump. The second pump 184 is utilized during a deposition process. The second pump 184 is generally configured to operate a relatively lower volumetric flow rate and/or pressure. For example, the second pump 184 is configured to maintain the processing region 160 of the process chamber at a pressure of less than about 50 mtorr. In another example, the second pump 184 maintains a pressure within the processing chamber of about 0.5 mtorr to about 10 Torr. The reduced pressure of the processing region 160 maintained during deposition facilitates deposition of a film having reduced neutral stress and/or increased $sp^2$-$sp^3$ conversion, when depositing carbon-based hardmasks. Thus, process chamber 100 is configured to utilize both relatively lower pressure to improve deposition and relatively higher pressure to improve cleaning.

In some embodiments, which can be combined with other embodiments described herein, both of the first pump 182 and the second pump 184 are utilized during a deposition process to maintain the processing region 160 of the process chamber at a pressure of less than about 50 mtorr. In other embodiments, the first pump 182 and the second pump 184 maintain the processing region 160 at a pressure of about 0.5 mTorr to about 10 Torr. A valve 186 is utilized to control the conductance path to one or both of the first pump 182 and the second pump 184. The valve 186 also provides symmetrical pumping from the processing volume 160.

The processing chamber 100 also includes a substrate transfer port 185. The substrate transfer port 185 is selectively sealed by an interior door 186A and an exterior door 186B. Each of the doors 186A and 186B are coupled to actuators 188 (i.e., a door actuator). The doors 186A and 186B facilitate vacuum sealing of the processing volume 160. The doors 186A and 186B also provide symmetrical RF application and/or plasma symmetry within the processing volume 160. In one example, at least the door 186A is formed of a material that facilitates conductance of RF power, such as stainless steel, aluminum, or alloys thereof. Seals 116, such as O-rings, disposed at the interface of the spacer 110 and the chamber body 192 may further seal the processing volume 160. A controller 194 coupled to the processing chamber 100 is configured to control aspects of the processing chamber 100 during processing.

Example of Adjustable De-Chucking Voltage

Figure 2:
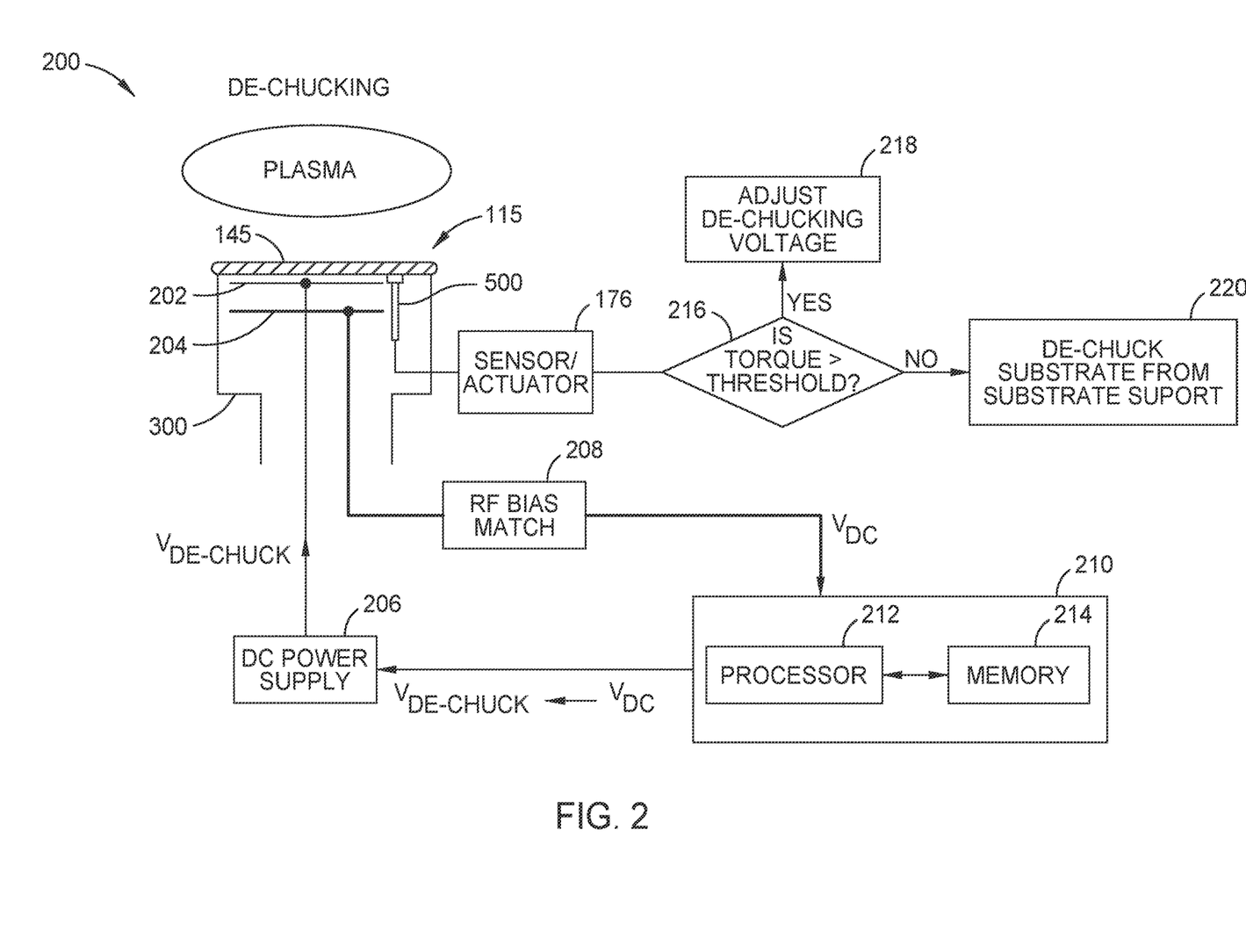
FIG. 2 is a diagram of an example system for de-chucking a substrate in a processing chamber.

FIG. 2 is a diagram of an example system 200 for de-chucking a substrate in a processing chamber (e.g., the processing chamber 100). In this example, a substrate 145 may disposed in the processing chamber and arranged on a cathode assembly 300, which may include the substrate support assembly 115 as described herein with respect to FIG. 1. The substrate 145 may be or include, for example, a wafer, cover wafer, or a workpiece associated with substrate processing as described herein. The substrate 145 may include a cover wafer used for chamber cleaning, for example, after a hardmask is deposited on a different substrate or workpiece. In some cases, the substrate 145 may include aluminum nitride (AlN), silicon oxide ($SiO_x$), or any combination thereof. In certain cases, the substrate 145 may include a material that has a different de-chucking voltage than silicon (Si), for example, due to variations in the material of the substrate 145. In the processing chamber, advanced patterning film(s) (e.g., an amorphous carbon hardmask film) may have been deposited on the substrate 145. In some cases, as the substrate 145 may be a temporary cover wafer, processing the substrate 145 in the chamber may include cleaning the chamber while the substrate 145 is electrostatically chucked to the cathode assembly 300.

The substrate support 115 includes a chucking electrode 202, which may be a mesh of a conductive material. The chucking electrode 202 is embedded in the substrate support 115. The chucking electrode 202 is coupled to a power source 206 that, when energized, electrostatically clamps the substrate 145 to the upper surface of the substrate support 115. During the de-chucking process, the chucking electrode 202 may be energized to facilitate an electrostatic discharge from the substrate 145. The chucking electrode 202 may be coupled through an RF filter (not shown) to the power source 206, which may provide direct current (DC) power to electrostatically secure (during plasma processing) and/or electrostatically discharge (during de-chucking) the substrate 145. The power source 206 may be or include a DC power source. The voltage supplied from the power source 206 may be regulated by a controller 210 to control the chucking voltage and/or de-chucking voltage as further described herein. De-chucking may be facilitated by the controller 210 to electrostatically discharge the substrate 145. Due to the relatively large volume of the processing chamber (e.g., created by the spacer 110), and the pressures at which processing chamber 100 operates during a PECVD process, higher power levels (compared to some PECVD processes) are used to establish and maintain a plasma. For example, about 4 KW of power to about 9 KW of power, at 110 amps, during a PECVD process may be applied to the cathode assembly 300. It is contemplated that amperage may be reduced to range of about 78 amps to about 80 amps, without film quality degradation, when using magnets (not shown) in a tuned configuration.

The substrate support 115 includes a heater element 204 suitable for controlling the temperature of a substrate 145 supported on an upper surface of the substrate support 115. The heater element 204 may be embedded in the substrate support 115. The substrate support 115 is resistively heated by applying an electric current from a heater power source (not shown) to the heater element 204. The heater power source may be coupled through an RF bias impedance matching circuit 208. In some cases, an RF filter (not shown) may be coupled between the heater element 204 and the heater power source to protect the heater power source from RF energy. The heater element 204 may be or include a nickel-chromium wire encapsulated in a nickel-iron-chromium alloy (e.g., INCOLOY® alloy) sheath tube. The electric current supplied from the heater power source may regulated by the controller 210 to control the heat generated by the heater element 204, thus maintaining the substrate 145 and the substrate support 115 at an effectively constant temperature during film deposition. The supplied electric current may be adjusted to selectively control the temperature of the substrate support 115 to be about −50° C. to about 600° C. During the de-chucking process, the heater element 204 may serve as an electrical probe to monitor the electrostatic discharge of the substrate 145, as further described herein.

Following the substrate processing, the processed substrate 145 may be removed from the processing chamber. For example, a de-chucking process may be performed to successfully remove the substrate 145 without damaging the substrate 145. During the de-chucking processor, the controller 210 may monitor a property associated with the lift pin assembly 500, for example, a torque applied to the lift pin assembly 500 as obtained from the actuator 176. The controller 210 may provide an indication to the power source 206 to supply a particular DC voltage ($V_{de\text{-}chuck}$), which may be referred to herein as a de-chucking voltage, to the chucking electrode 202, and the controller 210 may then attempt to lift the substrate 145 via the lift pin assembly 500 while the de-chucking voltage is being applied to the chucking electrode 202. The actuator 176 (or any suitable sensor) may provide a property (e.g., a torque, force, voltage level, current level, displacement, etc.) associated with the lift pin assembly 500 to the controller 210. The property may include, for example, a displacement of the lift pin assembly 500 relative to the chucking electrode, a force being applied to the lift pin assembly 500 via the actuator 176, a torque being applied to the lift pin assembly 500 via the actuator 176, a voltage level being applied to the actuator 176, a current level being applied to the actuator 176, a power level being applied to the actuator 176, or any combination thereof. Instead of or in addition to the actuator 176, a sensor (not shown) may measure the property associated with the lift pin assembly 500. For example, the sensor may be or include a torque gauge, a strain gauge, a proximity sensor, a voltage meter, a current meter, a power meter, etc.

If the property satisfies one or more criteria, the controller 210 may adjust the voltage level being applied to the chucking electrode. Otherwise, the state of the property may indicate to de-chuck the substrate 145 from the substrate support 115. For example, at activity 216, the controller 210 may identify whether the torque being applied by the actuator 176 is greater than a threshold (e.g., a particular level of torque). If the torque is greater than the threshold, at block 218, the controller 210 may adjust the de-chucking voltage (e.g., increase or decrease the de-chucking voltage depending on the electrostatic charge state of the substrate 145). If the torque is less than or equal to the threshold, at block 220, the controller 210 may indicate to the actuator 176 to move upward relative to the support substrate support 115 to de-chuck the substrate 145 from the substrate support 115. The controller 210 may continue to adjust the de-chucking voltage and monitor the torque output by the actuator 176 until the torque is less than or equal to the threshold.

In some aspects, the controller 210 may also monitor a voltage level ($V_{DC}$) associated with the heater element 204, for example, via the RF bias impedance matching circuit 208, which may include one or more electrical sensors, such as a voltage meter, amp meter, ohmmeter, a power meter, a current phase sensor, etc. The voltage level at the heater element 204 may be indicative of the voltage delta (difference) between the chucking electrode 202 and the substrate 145. The controller 210 may monitor whether the voltage delta is effectively zero to facilitate a discharge of the substrate 145. In some cases, the controller 210 may determine an updated de-chucking voltage based at least in part on the voltage level observed at the heater element 204 and/or the property associated with the lift pin assembly 500. For example, as the torque (or any suitable property associated with the lift assembly 500) being applied to the lift pin assembly 500 may be proportional to the voltage delta between the chucking electrode 202 and the substrate 145, the controller 210 may use the torque (or any suitable property) and the voltage level at the heater element 204 to determine the updated de-chucking voltage to use at the power source 206.

The controller 210 may include a processor 212 and a memory 214, for example. The controller 210 may be used to control the substrate processing sequence performed using the processing chamber, including, performing certain aspects of the de-chucking operation described herein. In some cases, the processor 212 may be configured for use in an industrial setting for controlling the processing chamber and sub-processors related thereto. The processor 212 may include a microcontroller, a microprocessor, an application processor, a central processing unit (CPU), a graphics processing unit (GPU), a neural network processor, a digital signal processor (DSP), an application specific integrated circuit (ASIC), a field programmable gate array (FPGA) or other programmable logic device (PLD), discrete gate or transistor logic, discrete hardware components, or any combination thereof. The memory 214 described herein, which is generally non-volatile memory, may include random access memory, read-only memory, floppy or hard disk drive, or other suitable forms of digital storage, local or remote. Software instructions (program) and data may be coded and stored within the memory 214 for instructing the processor 212. The memory 2145 may store data and program codes (e.g., computer-readable instructions) for the operations described herein, including the de-chucking operation. The memory 214 may be external to the processor 212 and/or incorporated therein.

Figure 3:
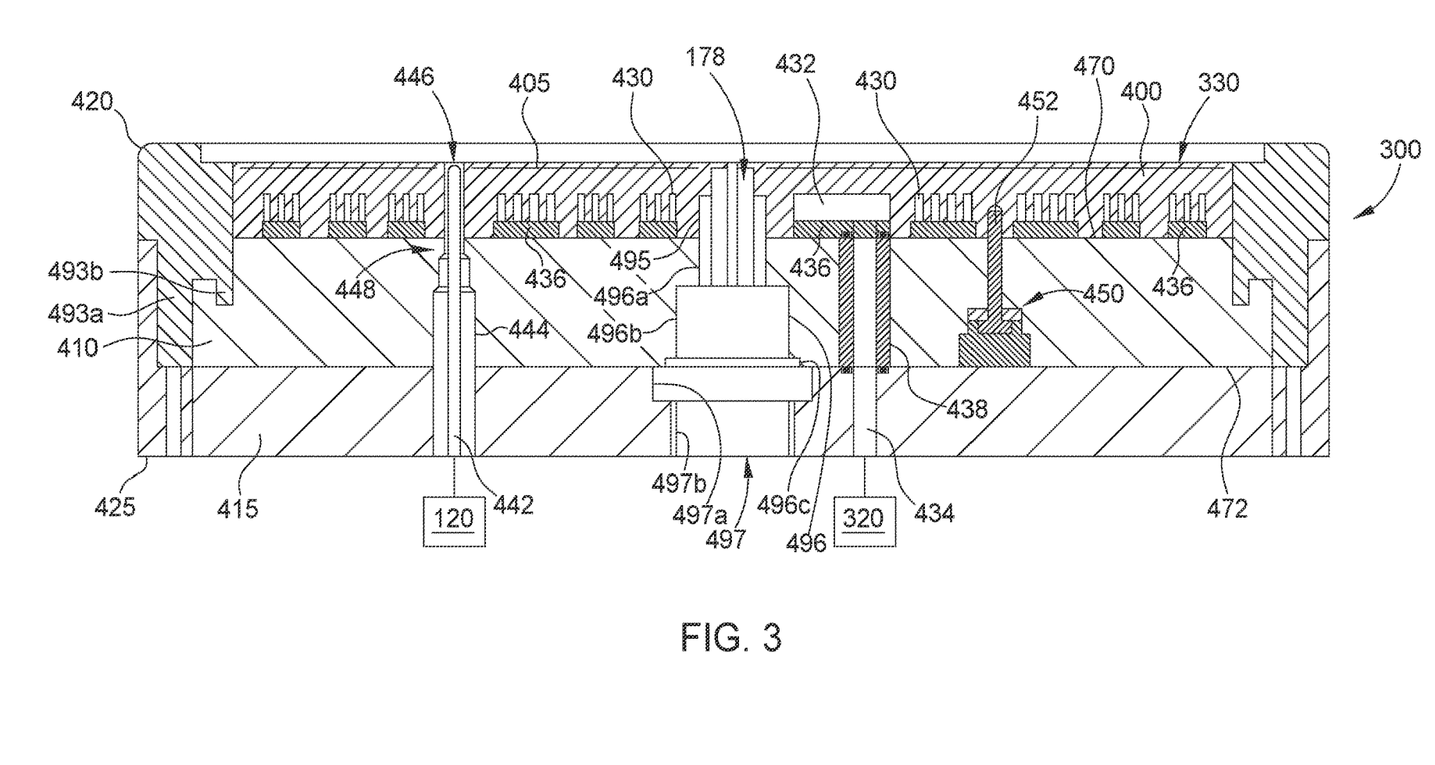
FIG. 3 is a schematic sectional view the substrate support.

FIG. 3 is a schematic sectional view of one embodiment of the substrate support 115. The substrate support 115 includes an electrostatic chuck 330. The electrostatic chuck 330 includes a puck 400. The puck 400 includes one or more electrodes 405 embedded therein. As an example, the one or more electrodes 405 may include a first electrode (e.g., the chucking electrode 202) used as a chucking electrode and a second electrode used as an RF biasing electrode. The substrate support 115 may be biased by providing RF power at a frequency of about 300 KHz to about 60 MHz to the second electrode. The frequency provided to the second electrode may be pulsed. The puck 400 is formed from a dielectric material, such as a ceramic material, for example aluminum nitride (AlN).

The puck is supported by a dielectric plate 410 and a base plate 415. The dielectric plate 410 may be formed from an electrically insulative material, such as quartz, or a thermoplastic material, such as high performance plastics sold under the tradename REXOLITE®. The base plate 415 may be made from a metallic material, such as aluminum. During operation, the base plate 415 is coupled to ground or is electrically floating while the puck 400 is RF hot (e.g., actively or passively, electrically energized). At least the puck 400 and the dielectric plate 410 are surrounded by an insulator ring 420. The insulator ring 420 may be made of a dielectric material such as quartz, silicon, or a ceramic material. The base plate 415 and a portion of the insulator ring 420 is surrounded by a ground ring 425 made of aluminum. The insulator ring 420 prevents or minimizes arcing between the puck 400 and the base plate 415 during operation. An end of the facilities cable 178 is shown in openings formed in the puck 400, the dielectric plate 410 and the base plate 415. Power for the electrodes of the puck 400, as well as fluids from a gas supply (not shown) to the substrate support 115, may be provided by the facilities cable 178 as described herein with respect to FIG. 1.

An edge ring (not shown) is disposed adjacent to an inner circumference of the insulator ring 420. The edge ring may comprise a dielectric material, such as), quartz, silicon, cross-linked polystyrene and divinylbenzene (e.g., REXOLITE® PEEK, $Al_2O_3$, AlN, among others. Utilizing an edge ring comprising such a dielectric material helps modulate the plasma coupling, modulating the plasma properties, such as the voltage on the substrate support ($V_{dc}$), without having to change the plasma power, thus improving the properties of the hardmask films deposited on substrates. By modulating the RF coupling to the wafer or substrate through the material of the edge ring, the modulus of the film can be decoupled from the stress of the film.

Each of the puck 440, the dielectric plate 410, and the base plate 415 include a respectively axially aligned opening formed therein or therethrough for accommodating the facilities cable 178. The puck 440 includes an opening 495 shaped to engage the facilities cable 178. For example, the opening 495 may be configured as a female receptacle for receiving the facilities cable 178. The dielectric plate 410 includes an opening 496 axially aligned with the opening 495. The opening 496 includes an upper portion 496a having a diameter about equal to the diameter of the opening 495, a middle portion 496b having a diameter with a diameter greater than the diameter of the upper portion, and a lower portion 496c having a diameter greater than a diameter of the middle portion 496b. The base plate 415 includes an opening 497 having an upper portion 497a with a first diameter and a lower portion 497b with a second diameter less than the first diameter. The multiple diameters the openings 496, 496, and 497 facilitate securing of the facilities cable 178 therein.

The puck 400 includes a plurality of fluid channels 430 formed therein. Each of the fluid channels 430 are in fluid communication with an inlet channel 432. The inlet channel 432 is fluidly coupled to an inlet conduit 434. The inlet conduit 434 is coupled to the coolant source 320. Each of the fluid channels 430 and the inlet channel 432 are sealed by a cap plate 436. The cap plates 436 may be made of the same material as the puck 400, or aluminum, and can be welded or otherwise bonded to the puck 400 to seal the fluid channels 430 and the inlet conduit 434. While not shown, an outlet conduit, similar to the inlet conduit 434, is provided in the substrate support 115 such that the cooling fluid can be recirculated therein.

A portion of the inlet conduit 434 is formed by a tubular member 438. The tubular member 438 is formed from a dielectric material such as ceramic materials. Seals are provided at ends of the tubular member 438 adjacent to the cap plates 436 and the base plate 415. The tubular member 438 prevents arcing that may be caused by the cooling fluid flowing therethrough. The tubular member 438 may also thermally insulate the dielectric plate 410 from the relatively cold cooling fluid flowing therein in order to prevent cracking of the dielectric plate 410.

The substrate support 115 also includes a plurality of lift pins 442 (only one is shown in FIG. 3). Each of the lift pins 442 are movably disposed in a dielectric bushing 444. Each of the lift pins 442 may be formed from a ceramic material, such as AlN, sapphire, quartz, or the like. The dielectric bushing 444 is provided in or through each of the puck 400, the dielectric plate 410 and the base plate 415. The dielectric bushing 444 is made of a polymer material, such as a polytetrafluoroethylene (PTFE) material. The dielectric bushing 444 includes an opening 446 along the length direction thereof where the lift pin 442 is guided. The opening 446 is sized slightly larger than the dimension (diameter) of the lift pin 442 such that a conductance path is formed in the dielectric bushing 444. For example, the opening 446 is coupled to the variable pressure system 120 such that vacuum conductance is provided between the processing volume 160 and through the dielectric bushing 444 to the variable pressure system 120. The conductance path provided by the opening 446 prevents arcing of the lift pins. The dielectric bushing 444 includes a plurality of steps 448 which are varied diameter sections. The steps 448 reduce arcing between the puck 400 and the base plate 415 by increasing the length of the path electricity may travel, as well as by introducing angular turns along the path.

The substrate support 115 also includes a plurality of fastener devices 450 (only one is shown). The fastener devices 450 are utilized to attach the puck 400 to the dielectric plate 410. Each fastener device 450 includes a fastener 452, a metallic washer 454 and a fastener cap 456 (the washer 454 and fastener cap 456 are shown in FIG. 4B). When the fastener 452 is tightened, the washer 454 is urged against a surface 458 of an opening 460 formed in the dielectric plate 410. The washer 454 and the fastener 452 are made from a metallic material, such as stainless steel. The washer 454 includes a rounded upper corner 462. The rounded upper corner 462 prevents cracking of the material of the dielectric plate 410 when the fastener 452 is tightened.

The fastener cap 456 is utilized to fill the remainder of the opening 460 in the dielectric plate 410. The fastener cap 456 includes a pocket 464 that is sized to receive the head of the fastener 452. The fastener cap 456 is formed from a dielectric material, such as a polymer, for example, polyether ether ketone (PEEK). The outer surface of the fastener cap 456 includes a step 466. The step 466 reduces arcing between the puck 400 and the base plate 415 by increasing the length of the path electricity may travel.

The substrate support 115 also includes a plurality of gaps between layers thereof. A first gap 470 is provided between the puck 400 and the dielectric plate 410. A second gap 472 is provided between the dielectric plate 410 and the base plate 415. The first gap 470 and the second gap 472 are in fluid communication with a gas supply (not shown). Fluids from the gas supply are flowed in the first gap 470 and the second gap 472 to prevent condensation between adjacent layers. Fluids in the first gap 470 and the second gap 472 are sealed on ends of the substrate support 115 by the edge ring. The edge ring may be sized to provide a controlled leakage of fluids from the first gap 470 and the second gap 472.

Figure 4A:
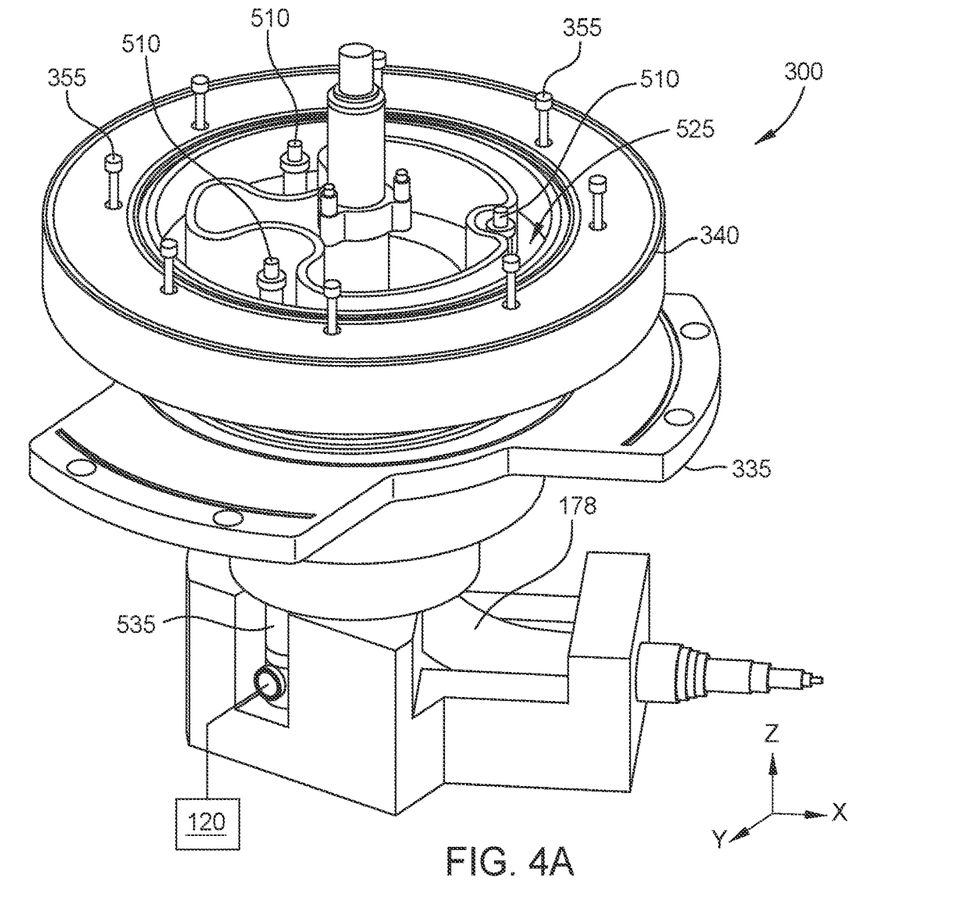
FIGS. 4A-4C are various views of a portion of a support structure and a cathode assembly of the substrate support.
Figure 4B:
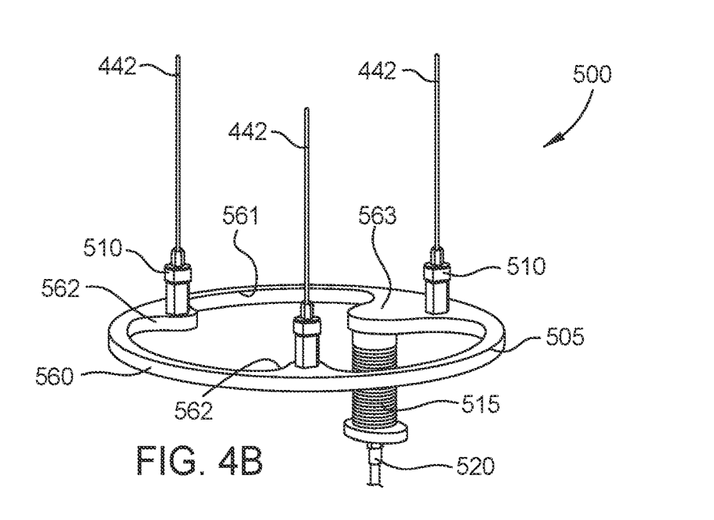
Figure 4C:
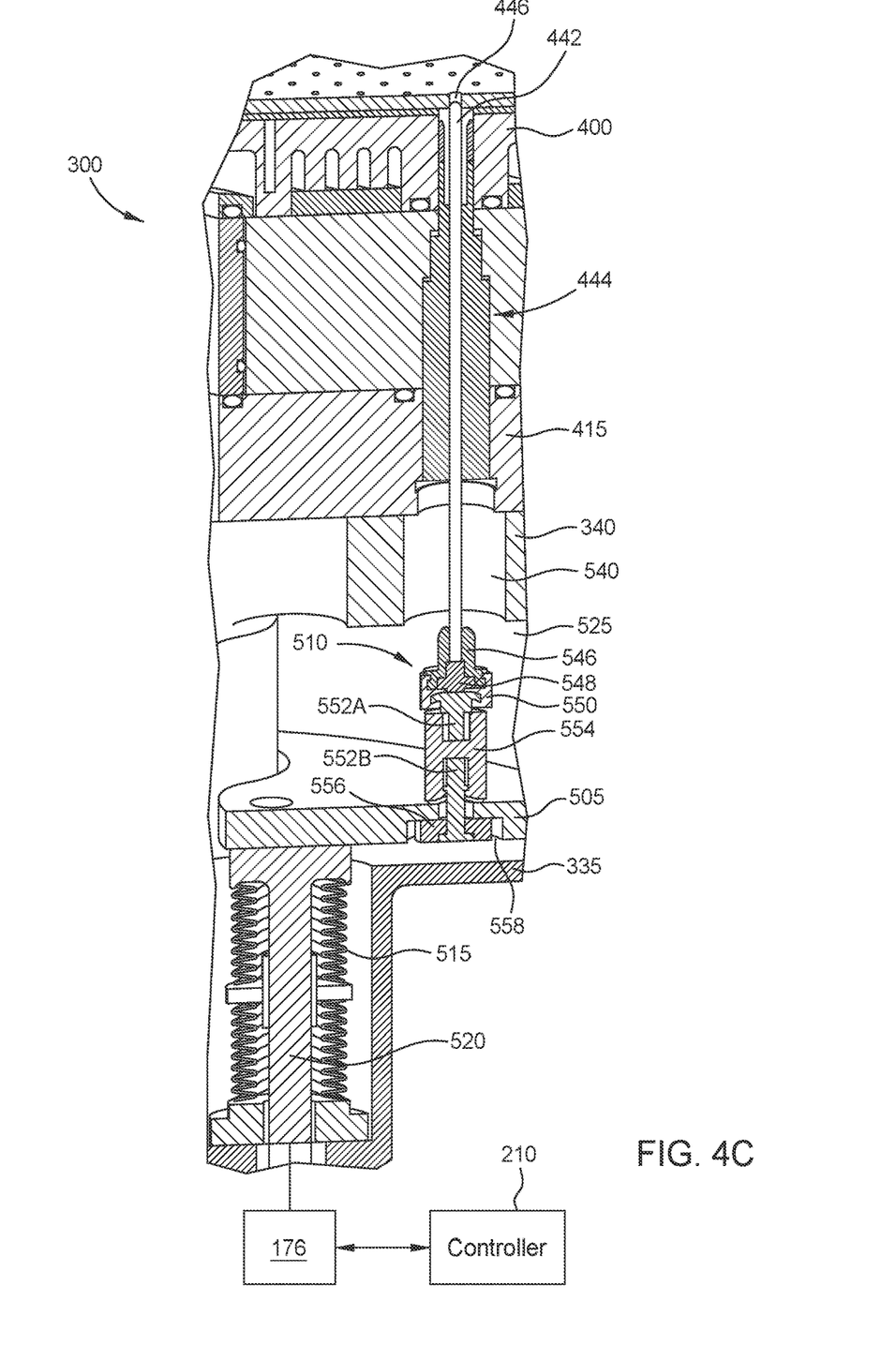

FIGS. 4A-4C are various views of a portion of the support structure 335 and the cathode assembly 300. FIG. 4A is a perspective view showing the base ring 340 above the support structure 335. FIG. 4B shows a lift pin assembly (spider) 500 that interfaces with the base ring 340 and the support structure 335. FIG. 4C is an enlarged partial sectional view of the cathode assembly 300 having the lift pin assembly 500 assembled therein.

As shown in FIG. 4A and FIG. 4B, the lift pin assembly 500 includes a ring body 505 (shown in FIG. 4B) having a pin grip device 510 coupled thereto. Each pin grip device 510 supports a lift pin 442 (shown in FIG. 4B). The lift pin assembly 500 also includes a bellows 515 housing a lift shaft 520 (both shown in FIGS. 4B-4C). The ring body 505 includes a circular or generally circular outer edge 560, and inner edge 561. The inner edge 561 is circular, and includes one or more lobes (two minor lobes 562 and one major lobe 563, which is greater in size than the minor lobes 562, is shown). The lobes 562, 563 are spaced at about equal angular distances from one another (such as about 120 degrees), and include a lift pin attached thereto. In addition. The lift shaft 520 is coupled to the major lobe 563, on a side opposite a respective lift pin 442. In such an example, the lift shaft 520 and the respective lift pin are axially aligned, but other configurations are also contemplated.

The ring body 505 is adapted to fit and move vertically (in the Z direction) in a vacuum channel 525 (shown in FIGS. 4A and 4C). The vertical movement of the ring body 505 is provided by the actuator 176 (shown in FIG. 4C) to lift and lower the lift pins 442 coupled to the pin grip devices 510. As described herein, the actuator 176 may be in communication with the controller 210. For example, the controller 210 may control when the actuator 176 is operating and/or control the output power (e.g., corresponding to a particular torque or force being applied to the lift pin assembly 500) associated with the actuator 176. The actuator 176 may provide the controller 210 with a property associated with the lift pin assembly 500 as described herein. The vacuum channel 525 is in fluid communication with the variable pressure system 120 via one or more vacuum conduits 535 (shown in FIG. 4A). In this manner, conductance paths are formed around the lift pins 442 via the openings 446 in the dielectric bushings 444.

Referring to FIG. 4C, the lift pins 442 extend from the pin grip device 510 to the dielectric bushing 444 through openings 540 formed in the base ring 340.

Each pin grip device 510 includes a gripper 546, a gripper stem 548 and a gripper housing 550. The gripper housing 550 is coupled to a first fastener 552A that couples the gripper housing 550 to a standoff 554. A second fastener 552B couples the standoff 554 to the ring body 505. A fastener plate 556 secures the second fastener 552B to the ring body 505. The fastener plate 556 and the second fastener 552B are positioned in a recess 558 formed in a lower surface of the ring body 505.

The gripper housing 550, the first fastener 552A, the second fastener 552B, the fastener plate 556 and the bellows 515 are fabricated from a metallic material, such as stainless steel. The gripper 546, the gripper stem 548, the standoff 554 and the ring body 505 may be fabricated from a dielectric material, such as a polymer or a ceramic material. In a specific example, the gripper 546 and the gripper stem 548 may be made of a plastic material, such as polyimide plastic material. The standoff 554 may be made from a PEEK material. The ring body 505 may be made from aluminum oxide ($Al_2O_3$). Any metallic materials in or on the ring body 505 and the pin grip device 510 are grounded or electrically floating during operation of the cathode assembly 300.

Figure 5:
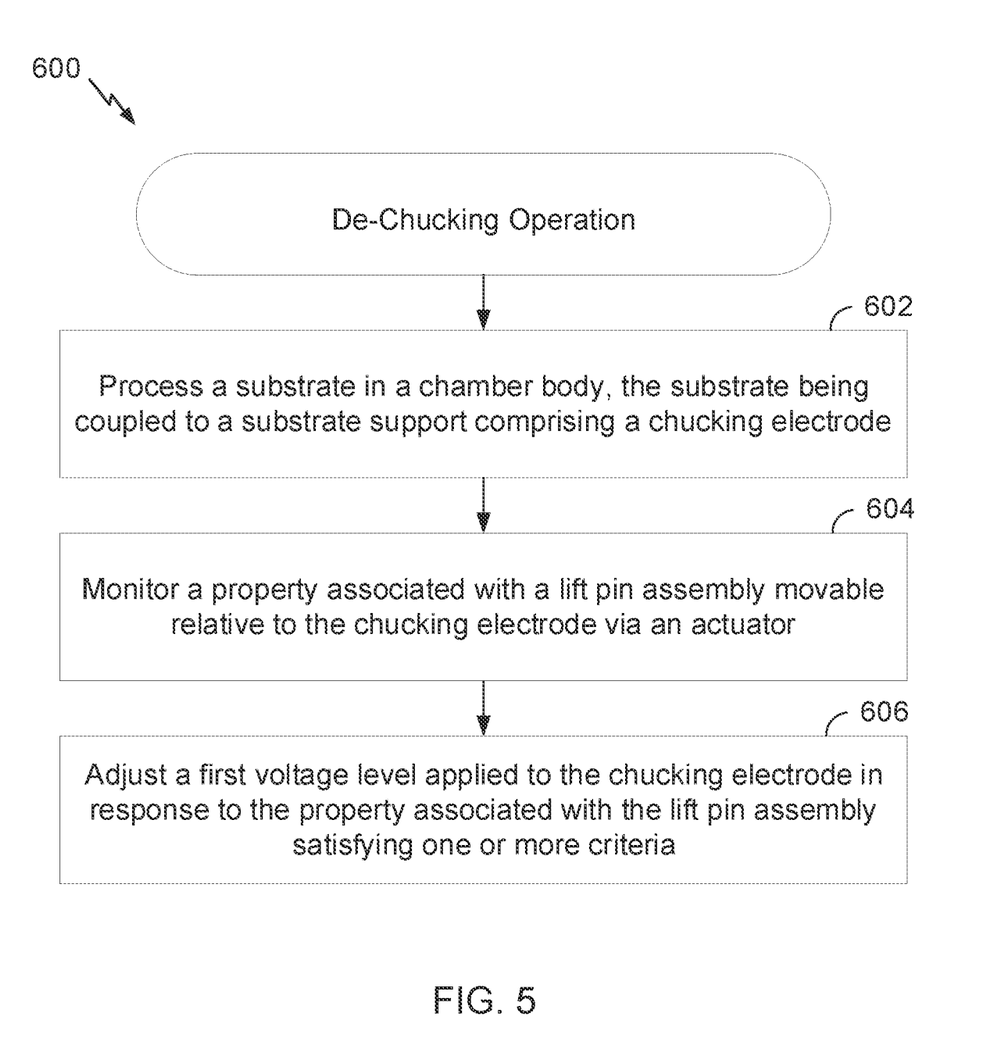
FIG. 5 is a flow diagram of an example de-chucking operation.

FIG. 5 is a process flow diagram illustrating a method 600 for de-chucking a substrate. The method 600 may be performed by a de-chucking system, such as the system 200 associated with a processing chamber (e.g., the processing chamber 100), and/or a processing chamber controller (e.g., the controller 210).

The method 600 may optionally begin at activity 602, where the system may process a substrate (e.g., the substrate 145) in a chamber body (e.g., the chamber body 192). The substrate may be coupled to a substrate support (e.g., the substrate support 115) comprising a chucking electrode (e.g., the chucking electrode 202). As an example, processing the substrate may include electrostatically clamping the substrate to the substrate support via an actively applied chucking voltage, such that the substrate is electrostatically charged to the substrate support. In some cases, the substrate may include aluminum nitride (AlN), silicon oxide ($SiO_x$), or a combination thereof.

At activity 604, the system may monitor a property associated with a lift pin assembly (e.g., the lift pin assembly 500) movable relative to the chucking electrode via an actuator (e.g., the actuator 176). As an example, the system may monitor a torque being applied to the lift pin assembly via the actuator, and the property associated with the chucking electrode may satisfy the one or more criteria when the torque is greater than or equal to a threshold (e.g., a particular torque level). In some cases, the system may monitor any suitable property associated with the de-chucking process, such as a property associated with the electrodes and/or heater elements, a property associated with the substrate, etc.

At activity 606, the system may adjust a first voltage level (e.g., the de-chucking voltage) applied to the chucking electrode in response to the property associated with the lift pin assembly satisfying one or more criteria.

In certain aspects, the property associated with the lift pin assembly may include any suitable property indicative of the discharge state of the substrate. For example, the property may include a displacement of the lift pin assembly relative to the chucking electrode, a force being applied to the lift pin assembly, a torque being applied to the lift pin assembly, a voltage level being applied to the actuator, a current level being applied to the actuator, or any combination thereof. For certain aspects, the property associated with the lift pin assembly satisfies the one or more criteria when the property is greater than or equal to a threshold.

In some aspects, the system may monitor a voltage level at an electrode or other electrical component adjacent to the chucking electrode or substrate. Such a voltage may be indicative of the discharge state associated with the substrate. As an example, the system may monitor a second voltage level associated with a heater element (e.g., the heater element 204) of the substrate support, and to adjust the first voltage level, the system may adjust the first voltage level based at least in part on the second voltage level and/or the property. In certain cases, the system may determine a de-chucking voltage for the substrate based at least in part on the second voltage level and/or the property, and the system may adjust the first voltage level to the de-chucking voltage. The system may adjust the first voltage level until the property is less than or equal to a threshold. For example, the system may continue to adjust the first voltage level and monitor the property until the property is less than or equal to a threshold.

In response to the property indicating that it is safe to de-chuck the substrate (e.g., de-chucking without damaging the substrate and/or the processing chamber), the system may de-chuck the substrate from the substrate support using the lift pin assembly. For example, the property may be less than or equal to a threshold, and at such a level, the property may be indicative of the substrate being electrostatically discharged and safe to remove from the processing chamber without damaging the substrate and/or the processing chamber.

Aspects of the disclosure facilitate improved dechucking of substrates and/or cover substrates from substrate supports. Due to differing compositions of substrates, a dechucking voltage (e.g., a voltage to counteract the electrostatic hold) to be applied may vary slightly from substrate to substrate. Conventionally, these variances resulted in either insufficient dechucking voltage, and thus difficulty removing the substrate from the substrate support, or excess dechucking voltage, which can result in excess substrate movement or breakage. In contrast, aspects of the present disclosure facilitate proper application of dechucking voltages, even when using substrates of different composition. For example, a baseline dechucking voltage (selected to have a reduced likelihood of substrate slippage or breakage) may be initially utilized. If the baseline dechucking voltage is insufficient, based upon data provided by an actuator or sensor to a controller, a dechucking voltage may be increased by a predetermined amount, such as 3 percent to 5 percent, or 5 percent to 10 percent, or by another value. The process may continue interactively until a sufficient dechucking voltage is realized.

While the foregoing is directed to embodiments of the present disclosure, other and further embodiments of the disclosure can be devised without departing from the basic scope thereof, and the scope thereof is determined by the claims that follow.

The invention claimed is:

1. A method of de-chucking a substrate disposed in a process chamber, comprising:
   processing a substrate in a chamber body, the substrate being coupled to a substrate support comprising a chucking electrode;
   monitoring a property associated with a lift pin assembly movable relative to the chucking electrode via an actuator;
   adjusting a first voltage level applied to the chucking electrode in response to the property associated with the lift pin assembly satisfying one or more criteria; and
   monitoring a second voltage level associated with a heater element of the substrate support, wherein adjusting the first voltage level comprises adjusting the first voltage level based at least in part on the second voltage level.

2. The method of claim 1, wherein:
   monitoring the property comprises monitoring a torque being applied to the lift pin assembly via the actuator; and
   the property associated with the chucking electrode satisfies the one or more criteria when the torque is greater than or equal to a threshold.

3. The method of claim 1, wherein the property comprises:
   a displacement of the lift pin assembly relative to the chucking electrode,
   a force being applied to the lift pin assembly,
   a torque being applied to the lift pin assembly,
   a voltage level being applied to the actuator,
   a current level being applied to the actuator, or
   any combination thereof.

4. The method of claim 1, wherein the property associated with the lift pin assembly satisfies the one or more criteria when the property is greater than or equal to a threshold.

5. The method of claim 1, wherein adjusting the first voltage level comprises adjusting the first voltage level until the property is less than or equal to a threshold.

6. The method of claim 1, further comprising de-chucking the substrate from the substrate support using the lift pin assembly.

7. The method of claim 1, wherein the substrate comprises aluminum nitride (AlN), silicon oxide ($SiO_x$), or a combination thereof.

8. A method of de-chucking a substrate disposed in a process chamber, comprising:
   processing a substrate in a chamber body, the substrate being coupled to a substrate support comprising a chucking electrode;
   monitoring a property associated with a lift pin assembly movable relative to the chucking electrode via an actuator; and
   adjusting a first voltage level applied to the chucking electrode in response to the property associated with the lift pin assembly satisfying one or more criteria; and
   monitoring a second voltage level associated with a heater element of the substrate support, wherein adjusting the first voltage level comprises:
   determining a de-chucking voltage for the substrate based at least in part on the second voltage level; and
   adjusting the first voltage level to the de-chucking voltage.

9. A process chamber, comprising:
   a lid assembly;
   a substrate support disposed within a process volume, wherein the substrate support comprises a chucking electrode, a lift pin assembly, and a heater element, wherein the lift pin assembly is movable relative to the chucking electrode via an actuator;
   a power source electrically coupled to the chucking electrode;
   a memory; and
   a processor coupled to the memory, the processor being configured to:
   monitor a property associated with the lift pin assembly,
   adjust a first voltage level applied to the chucking electrode via the power source in response to the property associated with the lift pin assembly satisfying one or more criteria,
   monitor a second voltage level associated with the heater element of the substrate support, and
   adjust the first voltage level based at least in part on the second voltage level.

10. The process chamber of claim 9, wherein:
    to monitor the property, the processor is further configured to monitor a torque being applied to the lift pin assembly via the actuator; and
    the property associated with the chucking electrode satisfies the one or more criteria when the torque is greater than or equal to a threshold.

11. The process chamber of claim 9, wherein the property comprises:
    a displacement of the lift pin assembly relative to the chucking electrode,
    a force being applied to the lift pin assembly,
    a torque being applied to the lift pin assembly,
    a voltage level being applied to the actuator,
    a current level being applied to the actuator, or
    any combination thereof.

12. The process chamber of claim 9, wherein the property associated with the chucking electrode satisfies the one or more criteria when the property is greater than or equal to a threshold.

13. The process chamber of claim 9, wherein to adjust the first voltage level, the processor is further configured to adjust the first voltage level until the property is less than or equal to a threshold.

14. A process chamber, comprising:
a lid assembly;
a substrate support disposed within a process volume, wherein the substrate support comprises a chucking electrode, a lift pin assembly, and a heater element, wherein the lift pin assembly is movable relative to the chucking electrode via an actuator;
a power source electrically coupled to the chucking electrode;
a memory; and
a processor coupled to the memory, the processor being configured to:
 monitor a property associated with the lift pin assembly,
 adjust a first voltage level applied to the chucking electrode via the power source in response to the property associated with the lift pin assembly satisfying one or more criteria;
 monitor a second voltage level associated with the heater element of the substrate support;
 determine a de-chucking voltage for a substrate based at least in part on the second voltage level; and
 adjust the first voltage level to the de-chucking voltage.

15. A process chamber, comprising:
a lid assembly;
a chamber body coupled to the lid assembly by a spacer, the spacer and the chamber body defining a process volume;
a substrate support disposed and movable within the process volume, wherein the substrate support comprises a chucking electrode, a heater element, and a lift pin assembly, wherein the lift pin assembly is movable relative to the chucking electrode via an actuator;
a power source electrically coupled to the chucking electrode;
a memory; and
a processor coupled to the memory, the processor being configured to:
 monitor a property associated with the lift pin assembly,
 monitor a first voltage level associated with the heater element, and
 adjust a second voltage level applied to the chucking electrode via the power source based at least in part on the first voltage level in response to the property associated with the lift pin assembly satisfying one or more criteria.

16. The process chamber of claim 15, wherein:
the actuator is configured to output a torque being applied to the lift pin assembly;
to monitor the property, the processor is further configured to monitor the torque being applied to the lift pin assembly via the actuator; and
the property associated with the chucking electrode satisfies the one or more criteria when the torque is greater than or equal to a threshold.

17. The process chamber of claim 15, wherein the processor is further configured to:
determine a de-chucking voltage for a substrate based at least in part on the first voltage level; and
adjust the second voltage level to the de-chucking voltage.

18. The process chamber of claim 15, wherein to adjust the second voltage level, the processor is further configured to adjust the second voltage level until the property is less than or equal to a threshold.

* * * * *

UNITED STATES PATENT AND TRADEMARK OFFICE
CERTIFICATE OF CORRECTION

PATENT NO. : 12,431,339 B2  
APPLICATION NO. : 18/307931  
DATED : September 30, 2025  
INVENTOR(S) : Andrew Nguyen et al.

Page 1 of 1

It is certified that error appears in the above-identified patent and that said Letters Patent is hereby corrected as shown below:

In the Specification

In Column 8, Line 57, delete "4 KW" and insert -- 4 kW --.

In Column 8, Line 57, delete "KW" and insert -- kW --.

In Column 10, Line 61, delete "KHz" and insert -- kHz --.

In Column 11, Line 23, delete "as)," and insert -- as --.

In the Claims

In Column 16, Line 19, in Claim 8, delete "actuator; and" and insert -- actuator; --.

Signed and Sealed this  
Sixteenth Day of December, 2025

John A. Squires  
*Director of the United States Patent and Trademark Office*